United States Patent [19]

Kudoh

[11] Patent Number: 5,416,355
[45] Date of Patent: May 16, 1995

[54] SEMICONDUCTOR INTEGRATED CIRCUIT PROTECTANT INCORPORATING COLD CATHODE FIELD EMISSION

[75] Inventor: Hitoshi Kudoh, Kyoto, Japan

[73] Assignee: Matsushita Electronics Corporation, Osaka, Japan

[21] Appl. No.: 116,216

[22] Filed: Sep. 2, 1993

Related U.S. Application Data

[63] Continuation of Ser. No. 718,225, Jun. 20, 1991, abandoned.

[30] Foreign Application Priority Data

Jun. 25, 1990 [JP] Japan .................. 2-167137

[51] Int. Cl.⁶ .................. H01L 23/48; H01L 29/46; H01L 29/62; H01L 29/60
[52] U.S. Cl. .................. 257/529; 257/530; 257/734; 257/758; 257/760; 257/773; 257/798
[58] Field of Search .................. 357/65, 67, 68, 49, 357/55, 51, 71, 41; 361/104; 257/661, 734, 760, 759, 758, 773, 798

[56] References Cited

U.S. PATENT DOCUMENTS

| | | | |
|---|---|---|---|
| 3,303,400 | 2/1967 | Allison | 257/579 |
| 3,383,568 | 5/1968 | Cunningham | 357/71 |
| 4,252,840 | 2/1981 | Minami | 357/23.11 |
| 4,794,437 | 12/1988 | Palumbo | 257/355 |
| 4,920,401 | 4/1990 | Sakai et al. | 357/54 |
| 5,007,873 | 4/1991 | Goronkin et al. | 445/49 |

FOREIGN PATENT DOCUMENTS

| | | | |
|---|---|---|---|
| 0299461 | 7/1988 | European Pat. Off. | |
| 62-26843 | 2/1987 | Japan | 257/734 |
| 63-205916 | 8/1988 | Japan | 257/734 |

OTHER PUBLICATIONS

T. Ishijima et al., "A New CMOS Structure Using a Transistor on a Lateral Epitaxial Silicon Layer," Extended Abstracts of the 20th Conf on SSD, pp. 577–580, 1988.

M. Nakano, "3-D SOI/CMOS," IEDM 84, pp. 792–795, 1984.

Search Report for corresponding European Patent Application No. 91110391.

"Vacuum Microeletronics", J. Itho, Applied Physics; vol. 59, No. 2, 1990, pp. 164–169 w/partial Eng. Translation.

Primary Examiner—Mark V. Prenty
Assistant Examiner—Carl Whitehead, Jr.
Attorney, Agent, or Firm—Ratner & Prestia

[57] ABSTRACT

An electronic element is provided which includes a pair of electrodes (referred to as facing electrodes) formed within the groove of an insulating film on the substrate, the end portions of the electrodes being separated and facing each other in the groove. When a voltage of a predetermined value or more is applied between the facing electrodes, there occurs a cold cathode emission which causes a flow of electrons from one of the electrodes to the other. At that time, the facing electrodes are melted by heat generated by the applied voltage, and either a short circuit or insulation between the facing electrodes, is attained, depending on the selected structure of the element. In this way, the electronic element of the present invention can perform the protection of semiconductor devices and semiconductor circuits. Also, the electronic element of the present invention can perform the operation of selecting a desired load resistance to be applied to a specific circuit.

16 Claims, 9 Drawing Sheets

SEMICONDUCTOR INTEGRATED CIRCUIT PROTECTANT INCORPORATING COLD CATHODE FIELD EMISSION

This application is a continuation of application Ser. No. 07/718,225 filed Jun. 20, 1991, now abandoned.

BACKGROUND OF THE INVENTION

1. Field of the Invention

The present invention relates to an electronic element for protecting a semiconductor integrated circuit (IC), and more particularly, to an electronic element used in a circuit for protecting and switching specific circuits by the use of reversible or irreversible field emission of cold cathodes. It also relates to an electronic element used as an active element with triode characteristics which utilizes cold cathode emission.

2. Description of the Prior Art

In recent years, the dimension of semiconductor devices formed in an IC has become about 1 μm, and about one million semiconductor devices are integrated on an IC chip.

There has been a great demand for various functions in semiconductor devices to be integrated in an IC. Examples of the semiconductor devices include flip-flop circuits, NAND gates composed of complementary MOS transistors, which are used as logical circuits, dynamic random access memories (DRAMs), static random access memories (SRAMs), read only memories (ROMs), electrically programmable random access memories (EPROMs), electrically erasable programmable random access memories (EEPROMs), analog circuits, bipolar transistors, and fuses and anti-fuses capable of switching circuits.

In production of DRAMs or SRAMs which are large-scale integrated circuits, there is a high probability that defects may occur in these integrated circuits during the production steps thereof. To eliminate this problem, it is useful to replace a faulty memory with a spare memory previously provided by using a fuse or an anti-fuse. In the case of a fuse, all of the circuits are connected to each other, and then a fuse connected to a faulty circuit is eliminated by applying a high voltage or by irradiating with a laser beam. In the case of an anti-fuse, all of the circuits are not connected to each other, and then only the portion where an electrical connection is desired is applied with a high voltage or a laser.

In view of the above function of a fuse or an anti-fuse, the range of applications thereof is wide. For example, when a fuse or an anti-fuse is provided in each memory element, required data can be written in a predetermined memory element at any time. When a fuse or an anti-fuse is provided in a logical circuit, the logical circuit can be switched even after the fabrication thereof.

Electronic circuits are integrated on a semiconductor chip on a large scale, so that the construction thereof has been complicated. Various apparatus using an IC has rapidly been produced one after another, accompanied by the development of an IC. To shorten the period required for producing an IC, attempts have been made so that various kinds of circuits to be integrated on a semiconductor chip are previously constructed so as to change the combination of the circuits or switch the circuits after the integration. For example, a circuit formed in a semiconductor chip comprising an EPROM and an EEPROM as a microcomputer circuit is realized for the above purpose.

A conventional example using the above-mentioned fuse will be described. An oxide film and polycrystalline silicon (i.e., polysilicon) are deposited on a semiconductor substrate in this order. Impurities are diffused in the polysilicon to form a polysilicon island having an appropriate dimension. Predetermined two circuits are connected to each other through this island. When it is not necessary to connect these two circuits to each other, an excess amount of voltage is applied to both ends of the polysilicon which thereby fuses to eliminate the connection.

A conventional example using the above-mentioned anti-fuse will be described. A diffused layer is formed on a semiconductor substrate. On the diffused layer, a silicon nitride film and a metal layer are formed in this order. This metal layer is connected to the diffused layer through the silicon nitride film. Two predetermined circuits are electrically connected to the metal layer and the diffused layer, respectively. Under this condition, since the silicon nitride film is an insulating film, the metal layer is electrically insulated from the diffused layer. When it is necessary to electrically connect these two circuits, an excess amount of voltage is applied to the silicon nitride film to destroy it, resulting in an electrical connection between the metal layer and the diffused layer.

A semiconductor memory is selectively used in accordance with the types and applications of data. In general, an ROM is employed for repeatedly using the same data. When data to be written is not determined or when it is necessary to change data which has been written, various read only memories such as EPROMs and EEPROMs are used, which are UV-light or electrically erasable and electrically programmable. A DRAM is also employed for repeatedly writing data at suitable intervals so as to maintain written data. In a DRAM, written data is not maintained when a power source is turned off, so that a DRAM is suitable for frequently rewriting data. In an SRAM, written data can be maintained by flowing a smaller amount of current compared with that used for a writing operation. In the programmable memories such as EPROMs and EEPROMs, written data can be maintained even after a power source is turned off, because the data has been physically written therein.

Minute semiconductor devices described above are likely to be damaged by noise or surge entering from outside. To prevent this problem, a semiconductor device is provided with a protective circuit at its external portion. This protective circuit comprises a protective element for preventing an excess voltage such as spike noise and surge from being applied to circuits formed inside the semiconductor device. Moreover, signal lines are interrupted by using a power source wiring or a ground wiring, or a resistor constituted by a diffused layer or a PN junction is connected to an input/output terminal of an IC, thereby preventing surge and excess current from flowing into the IC.

An example will be described with reference to FIG. 17, in which a diffused layer (PN junction capacitance) is used for the purpose of protecting internal circuits when an excess voltage is applied to an external circuit which performs an input/output operation.

A power source Vdd is connected to the source of a transistor T1 and to a diode D1. The other end of the diode D1 is connected to an input Vin which is connected to the gate of the transistor T1. An output Vout is obtained from the drain of the transistor T1. The drain of the transistor T1 is grounded through a resistor R1.

The diode D1 functions as a protective diode by which the voltage of the input Vin does not become higher than that of the power source Vdd. When the voltage of the input Vin is lower than that of the power source Vdd, the protective diode D1 is reverse-biased, thereby preventing a current from flowing therethrough. When the voltage of the input Vin becomes higher than that of the power source Vdd, the diode D1 is forward-biased.

In a protective circuit using the above-mentioned diffused layer, there are two problems described below.

To protect circuits from unexpected spike noise and surge, a diffused layer having a certain area is required. However, it is difficult to reduce the size of the diffused layer along with the miniaturization of a semiconductor device.

Since a diffused layer prevents a voltage from rapidly changing due to surge or the like by using the junction capacitance and resistance of the diffused layer, or a protective diode, the transmission rate of input signals is delayed because of these capacitance and resistance.

When polysilicon is used as a fuse, the polysilicon is connected to one part of a wiring in a circuit. The resistance of the wiring connected to the fuse is high, so that the operation rate of the entire circuit is decreased. This problem can be solved by making the width of the fuse larger to decrease the resistance of the wiring. However, the application of a high voltage is required for cutting down this fuse, which cannot be realized.

When an anti-fuse is used, that is, when a silicon nitride film is formed on a diffused layer overlying a silicon substrate, and a metal layer is disposed on the silicon nitride film, the anti-fuse-formed area becomes large, thereby decreasing the degree of integration of semiconductor devices in a chip. To improve the degree of integration, the anti-fuse can be formed in the later step such as a wiring step. A structure of such a semiconductor device or a method for forming the same have not yet been proposed.

Cold cathode emission from electrodes is described, for example, in "Vacuum Microelectronics" (J. Itoh, Applied Physics, Vol. 59, No. 2 (1990) pp. 164–169). This literature discloses the formation of electrodes on various kinds of substrates by using a minute processing technique. An element obtained by this technique should be operated in a vacuum atmosphere. When this element is used in the air, the electrodes can readily be oxidized or damaged, so that the cold cathode emission properties thereof are rapidly degraded.

SUMMARY OF THE INVENTION

An electronic element of the present invention, which overcomes the above-discussed and numerous other disadvantages and deficiencies of the prior art, comprises, a substrate; a first insulating film having a groove, which is formed on the substrate; a pair of electrodes formed on the first insulating film and the inner surface of the groove, the end portions of the electrodes being separated and facing each other in the groove; and a second insulating film formed at least on the electrodes.

In a preferred embodiment, the substrate is made of a semiconductor material.

Another electronic element of the present invention, which overcomes the above-discussed and numerous other disadvantages and deficiencies of the prior art, comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed at least on the electrodes.

In a preferred embodiment, a cold cathode emission occurs from the end portions of the electrodes.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and faced with each other in the groove; and a third insulating film formed on the electrodes and the bottom face of the groove, the portion of the third insulating film, which is positioned on the bottom face of the groove, having a triangular cross-section.

In a preferred embodiment, the third insulating film has lower film density than that of the first and second insulating film.

In a preferred embodiment, the third insulating film has micro-cracks therein.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed on the electrodes and the bottom face of the groove, the portion of the third insulating film, which is positioned on the bottom face of the groove, having a triangular cross-section so as to form a void in the groove.

In a preferred embodiment, the inside of the void is under reduced pressure.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed at least on the electrodes, wherein a current flowing between the electrodes corresponds to two-thirds power of an applied voltage.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; a third insulating film formed at least on the electrodes; and a conductive film formed on the third insulating film.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed at least on the electrodes, wherein the substrate is provided with at least one semiconductor device.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; a third insulating film formed at least on the electrodes; and a conductive film formed on the third insulating film, wherein the electronic element has switching characteristics.

Still another electronic element of the present invention comprises a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; a third insulating film formed at least on the electrodes; and a conductive film formed on the third insulating film, wherein the substrate is provided with at least one semiconductor device, and the electronic element performs the operation of switching the semiconductor device.

Thus, the invention described herein makes possible the objectives of (1) providing an electronic element for protecting semiconductor devices to be integrated in an IC from surge and noise generated by a high voltage and a high current; (2) providing an electronic element which can be produced by a conventional process for producing an IC; (3) providing an electronic element which can change the circuit of an IC even after the formation of an IC; (4) providing an electronic element which can cause a short circuit or insulation by changing the portion of a metal layer which corresponds to facing electrodes; (5) providing an electronic element which can be used as an active element having triode properties by disposing an additional control electrode on the facing electrodes; and (6) providing an electronic element which can be miniaturized along with the miniaturization of other semiconductor devices.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The present invention will be described by reference to the following examples.

Figure 1:
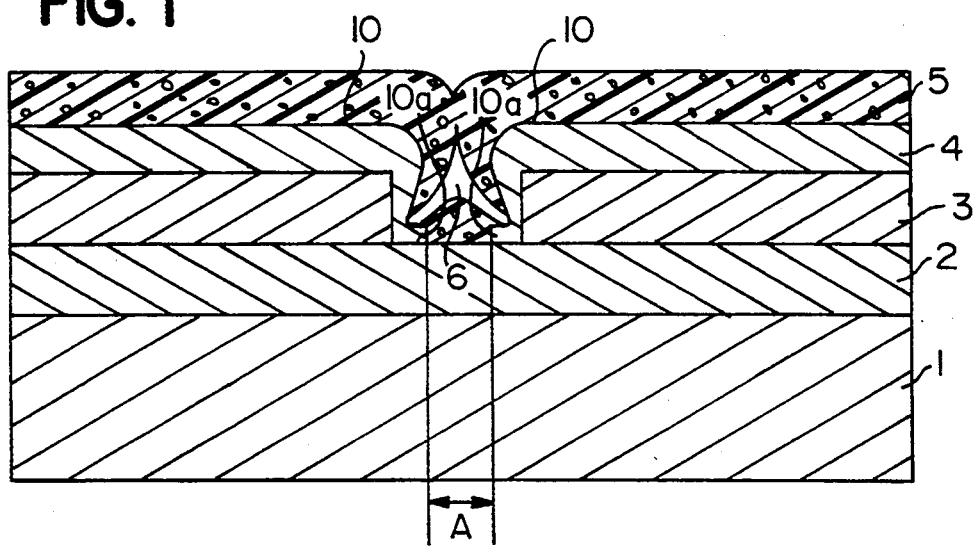
FIG. 1 is a sectional view showing the first example of an electronic element according to the present invention.

An electronic element of a first example according to the present invention is shown in FIG. 1.

An oxide film (silicon oxide film) 2 is formed by an atmospheric pressure CVD method on the entire surface of a substrate 1 of a semiconductor, a conductor, or an insulator. The thickness of the oxide film 2 is 500 nm. Another oxide film 3 with a thickness of 500 nm is formed on the oxide film 2 by a plasma CVD method.

A predetermined groove is formed on the oxide film 3 by using a resist pattern. Film layers 2 and 3 form an insulating film having a groove, which is formed on the substrate. On the oxide film 3, a metal layer 4 made of an aluminum alloy is formed. A sputtering method is used to form the metal layer 4, so that the thickness of the metal layer 4 on the side walls of the groove is thinner than that on the flat part of the oxide film 3. In other words, in the formation of the metal layer 4, the step coverage on the groove is poor. Especially, as an angle formed by the flat part and the groove of the oxide film 3 approaches 90°, the step coverage becomes worse. This phenomenon is a characteristic of the sputtering method. In the sputtering method, metal particles such as atoms and molecules randomly reach the substrate by the physical force of ions. It is required that the metal particles be incident onto the side walls of the groove at a specific angle. Even though the metal particles are incident at the specific angle, a part of the metal particles directed to the groove are deposited on the flat part of the oxide film 3. Therefore, the amount of the metal layer 4 deposited on the groove is smaller than that deposited on the flat part of the oxide film 3. Furthermore, the quality of the metal layer 4 on the groove is less satisfactory than that on the flat part.

In the process of depositing the metal layer 4 on the flat part of the oxide film 3, two edge portions of the groove are enlarged with the metal deposited in the horizontal direction. As a result, "overhang" portions are formed on the two edge portions. These "overhang" portions cause a decrease in the absolute amount of the metal particles for the formation of the metal layer 4 which are incident to the groove. Because of this, the amount of metal deposited as the metal layer 4 on the side walls and the bottom of the groove is extremely decreased. Finally, the side walls of the groove are tapered toward the upper ends thereof. This phenomenon is not limited to the sputtering method used for forming the metal layer 4. For example, the same results can be obtained when the CVD method is used for forming an oxide film and a nitride film.

The groove has a width of about 0.2 to 1.5 $\mu$m and a length of about 0.2 to 20.0 $\mu$m. The thickness of the metal layer 4 on the flat part of the oxide film 3 is 0.6 $\mu$m. The "overhang" portions extend from the edge portions of the groove by 0.1 $\mu$m in the horizontal direction. The thickness of the metal layer 4 formed on the bottom of the groove is about 0.2 $\mu$m.

It is not essential in the present invention to form the "overhang" portions, since the "overhang" portions do not influence the cold cathode emission from an end portion of one of facing electrodes described later.

After being deposited, the metal layer 4 is uniformly etched by high-anisotropic dry etching to remove unnecessary part. The metal layer 4 formed at the corner of the bottom of the groove alone is remained. This process is a general method for producing a semiconductor device.

The metal layer 4 formed as described above constitutes a pair of facing electrodes 10 along the groove. A length A between end portions 10a of the facing electrodes 10 is in the range of about 0.2 to 20.0 $\mu$m.

A protective film 5 made of an oxide film is formed on the entire surface of the metal layer 4 by the plasma CVD method. It is known that a step coverage of a film formed on the groove by the plasma CVD method is better than that formed by the atmospheric pressure CVD method. Also, the step coverage largely depends on the type of a film to be formed. The step coverage of an oxide film is worse than that of a nitride film.

On the bottom of the groove, the film can be formed with a satisfactory step coverage, but this film is likely to have micro-cracks and a low-density region with a high rate in the etching by fluoric acid.

Next, the formation of a void 6 will be described. In the process of depositing the protective film 5 on the flat part of the metal layer 4, two edge portions of the groove are enlarged with the film 5 deposited in the horizontal direction. At the same time, the protective film 5 is formed on the bottom of the groove. The amount of the protective film 5 formed in the innermost portion of the side wall of the groove is very small. Along with the formation of the protective film 5 on the edge portions of the groove, "overhang" portions are formed. These "overhang" portions cause the absolute amount of particles of the oxide film which are incident onto the groove to decrease. These "overhang" portions interrupt the invasion of the protective film 5 into the groove. Because of this, the amount of particles deposited as the protective film 5 on the bottom of the groove is determined in accordance with the distance between the "overhang" portions. The cross section of the protective film 5 formed on the bottom of the groove becomes a triangle, and the two "overhang" portions come into contact with each other. Thereafter, the protective film 5 is not deposited cold on the bottom any more, even though the deposition thereof is continued. The void 6 is formed between the protective film 5 deposited on the bottom of the groove and the protective film 5 deposited as the "overhang" portions on the flat part of the metal layer 4. In this example, portions of the facing electrodes 10 forming the side walls of the groove need not be so formed as to have an upwardly tapered surface.

The formation of this void 6 is determined by the depth of the groove, and by the thickness and shape of the metal layer 4. Even though the void 6 is not formed, when the protective film 5 formed between the end portions 10a of the electrodes 10 have micro-cracks or a low-density region, the same effects can be obtained. The protective film 5 having micro-cracks or a low-density region has extremely poor electrical insulation property. As described above, the void 6 is formed between the pair of facing electrodes 10.

In an electronic element having the above-mentioned construction, a voltage is applied between the right and left portions of the metal layer 4. The left portion of the metal layer 4 is grounded. When a voltage is applied between the facing electrodes 10, an electric field between the end portions 10a of the metal layer 4 becomes large. This electric field enables electrons to be emitted from one of the end portions 10a of the metal layer 4. These electrons are absorbed by the other end portion 10a of the metal layer 4 via the protective film 5. In this way, the electric field causes the cold cathode emission in the electronic element, whereby an electric current flows between the end portions 10a.

If a silicon oxide film containing phosphorous or boron is formed as a protective film 5 by the atmospheric pressure CVD method, or if the protective film 5 is not formed, a satisfactory cold cathode emission cannot be performed. The reason for this is that the reduced pressure condition required for performing a cold cathode emission cannot be provided. On the other hand, according to the present invention, the reduced pressure condition can be obtained in the void 6 or in the micro-cracks or the low-density region of the protective film 5 in the area corresponding to the void 6, thereby attaining a satisfactory cold cathode emission.

It is preferable that the oxide film 3 has a thickness of 300 nm to 1 $\mu$m so that the void 6 be formed between the pair of facing electrodes. The groove preferably has a width of 0.2 to 1.5 $\mu$m and a length of 0.2 $\mu$m to 20 $\mu$m for the formation of the void 6 therein. The metal layer 4 can be made of various kinds of metals such as aluminum, tungsten, and titanium, and the preferred thickness thereof is in the range of 0.1 $\mu$m to 1.6 $\mu$m. The protective films can be an insulator formed by a low pressure CVD method, such as a plasma-silane type oxide film, a plasma-TEOS type oxide film, a plasma-silane type nitride film, a plasma-silane type oxide nitride film, and an ozone TEOS type oxide film. The thickness of the protective film is determined so that two edge portions of the groove are in contact with each other, and that the void 6 is formed. This thickness depends on the dimension of the groove, the thickness of the electrode and the oxide film 3. The preferable range thereof is 0.4 μm to 1.2 μm.

During the chemical vapor deposition for the formation of the protective film 5, the void 6 is formed and filled with a source gas of silane and a carrier gas. When the airtightness of the void 6 is extremely reduced, the cold cathode emission is not likely to occur. In the present example, the protective film is formed on the upper portion of the element, and moreover, the protective film having micro-cracks and degraded film property is used, so that a current can flow therethrough. Thus, in the electronic element of this example, cold cathod emission can be readily effected.

Since the cold cathode emission occurs in the electric field of about 30 kV/cm or more, an applied voltage required for performing the cold cathode emission is in the range of about 0.3 to 5 V in the electronic element having the distance between the facing electrodes (interelectrode distance) of 0.1 to 1.7 μm.

Figure 2:
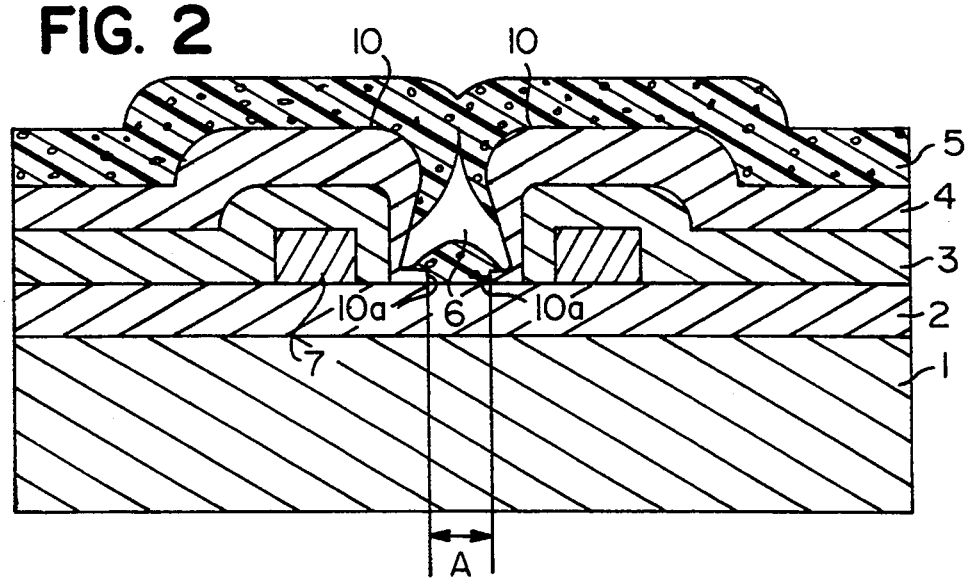
FIG. 2 is a sectional view showing the second example of an electronic element according to the present invention.

FIG. 2 is a sectional view showing the second example of an electronic element according to the invention. In this example, the depth of the groove is enlarged so that a film having micro-cracks or a film having low density be readily formed between the end portions 10a of the electrodes 10.

In FIG. 2, the oxide film 2 with a thickness of 500 nm is formed on the entire surface of the substrate 1 made of various kinds of materials such as a semiconductor, a conductor, and an insulator. On the oxide film 2, polysilicon portions 7 having a thickness of 400 nm are formed in a prescribed pattern so as to sandwich the end portions 10a of the pair of facing electrodes 10.

The oxide film 3 having a thickness of 500 nm is formed so that it covers the surfaces of the polysilicon portions 7 and the oxide film 2. The groove is provided between the two polysilicon portions 7 and on the oxide film 3 by using a resist pattern, and has side walls perpendicular to the substrate 1. Because of this, it is desired that the patterns of the polysilicon portions 7 are formed so as to have side walls perpendicular to the substrate 1. When the side walls of the polysilicon portions 7 are tapered to cause the oxide film 3 formed thereon to have tapered side walls, dry etching is performed from the top end portion of the oxide film 3 down to the substrate 1 so that a groove having side walls perpendicular to the substrate 1 be formed. When the oxide film 3 is excessively dry-etched to expose the polysilicon portion 7, the polysilicon portion 7 comes into contact with the metal layer 4 to be formed in the succeeding step, which causes a short circuit.

The metal layer 4 made of aluminum is formed on the oxide film 3 by a sputtering method. In the same manner as in the first example, the metal layer 4 has "overhang" portions and has side walls tapered toward the upper ends thereof. The metal layer 4 functions as the pair of electrodes 10 having the end portions 10a.

The protective film 5 is formed on the metal layer 4 by a plasma CVD method as in the first example. The void 6 is formed between the electrodes 10.

Because of the polysilicon portions 7, the height of the side walls of the groove is higher than that of the first example. When the width of the groove is equal to that of the first example, the void 6 formed in the groove becomes larger than that of the first example. When the void 6 is large, the protective film 5 with micro-cracks or with a low-density region can be stably formed between the end portions 10a of facing electrodes 10, so that the distance between the metal layers 4 can be made larger.

In the electronic element having the above-mentioned construction, a voltage is applied between the facing electrodes 10. One of the facing electrodes 10 disposed on the left side of the groove is grounded.

When a voltage is applied between the facing electrodes 10, the electric field between the end portions 10a of the facing electrodes 10 becomes large. In this electric field, electrons are emitted from one of the end portions 10a and are absorbed by the other end portion 10a via the protective film 5. In this way, the electric field causes the cold cathode emission, and an electric current flows between the end portions 10a of the facing electrodes 10.

Various kinds of silicide and polycide (a form construction of silicide and polysilicon), a metal (aluminum, tungsten, and titanium) can be used for the polysilicon portions 7. The thickness of the polysilicon portions 7 is preferably in the range of 0.2 to 2.0 μm.

Figure 3:
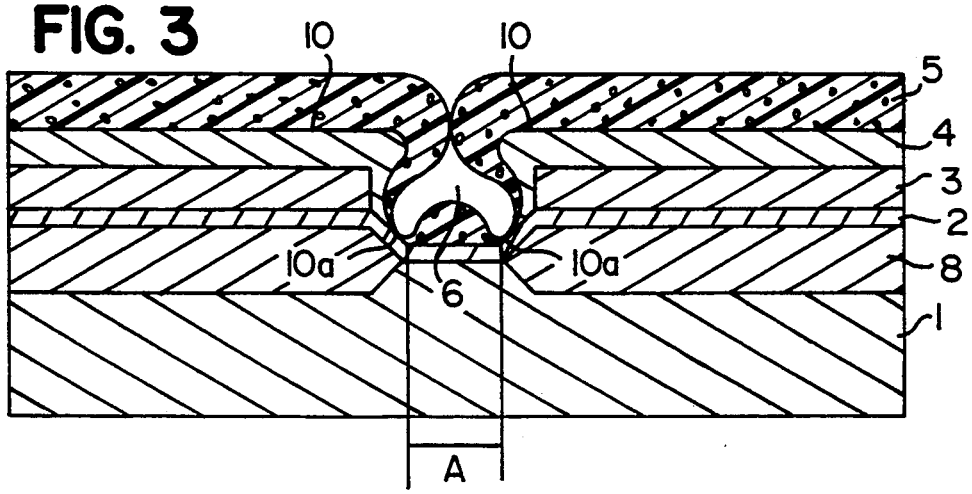
FIG. 3 is a sectional view showing the third example of an electronic element according to the present invention.

FIG. 3 shows the third example of an electronic element in which the void 6 is made larger than that of FIG. 1 and is made smaller than that of FIG. 2.

In this example, a local oxidation of silicon film 8 with a thickness of 700 nm is formed on the substrate 1, excluding a groove portion where the cold cathode emission occurs. The portion of the substrate 1 which is not covered with the local oxidation of silicon film 8 is in direct contact with the oxide film 2 having a thickness of about 300 nm. The other portion of the oxide film 2 is formed on the local oxidation of silicon film 8. The oxide film 3 having a thickness of about 500 nm is formed on a portion of the oxide film 2 other than the groove portion. In this example, the oxide film 3 is formed on the portion other than the portion of the oxide film 2 located between the positions at which the thickness of the local oxidation of silicon film 8 becomes about 500 nm. The metal layer 4 made of aluminum covers the upper and side surfaces of the oxide film 3, and the exposed portion of the oxide film 2. The metal layer 4 forms a pair of facing electrodes 10 along the groove of the oxide film 3. A resist pattern is formed along the groove of the oxide film 3, after which a predetermined region of the metal layer 4 is removed by using dry etching.

On the entire surface of the metal layer 4 is formed the protective film 5. The protective film 5 covers the surface of the metal layer 4 and the exposed portion of the oxide film 2. As described above, when the protective film 5 is formed on the metal layer 4, the protective film 5 formed on the "overhang" portions of the metal layer 4 is enlarged in the horizontal direction. The groove is finally closed by the protective film 5. Once the groove is closed, the protective film 5 is not formed on the exposed portion of the oxide film 2 any more. As the deposition of the protective film 5 proceeds, the opening to the groove becomes smaller. Thus, the area of the protective film 5 deposited on the exposed portion of the oxide film 2 becomes smaller as the protective film 5 becomes thicker. The protective film 5 formed on the exposed portion of the oxide film 2 is triangular in cross section. In this way, the void 6 is formed between the facing electrodes 10. The length between the end portions 10a of the facing electrodes 10 is denoted as A.

In this example, the end portions 10a of the electrodes 10 are formed on the slope of the oxide film 2. The thickness of the end portions 10a is thinner than that of FIGS. 1 and 2. The area of the end portions 10a largely influences the current-voltage characteristics of the electronic element described later.

The types and thickness of the films are the same as those in FIG. 1.

The electronic elements described with reference to FIGS. 1, 2, and 3 can readily be produced by using a lithography technique in which a groove with a predetermined pattern is formed by using an appropriate mask. The method for producing these electronic elements can be readily applied to the production of an IC. Because of this, these electronic elements can be produced with the mask pattern for the electronic elements incorporated into an ordinary mask pattern for use in the production of the IC.

For example, the above-mentioned local oxidation of silicon film 8 is generally used for separating elements. The polysilicon for the portions 7 are used for a gate electrode. The oxide films 2, 3, and 5 correspond to an insulating film between the circuit layers of an IC. The metal layer 4 functioning as the electrode 10 can be applied to the metal layers used in an IC. A predetermined pattern can be formed on the local oxidation of silicon film 8, polysilicon portion 7, oxide film 3, and electrodes 10 by a lithography technique.

Figure 4:
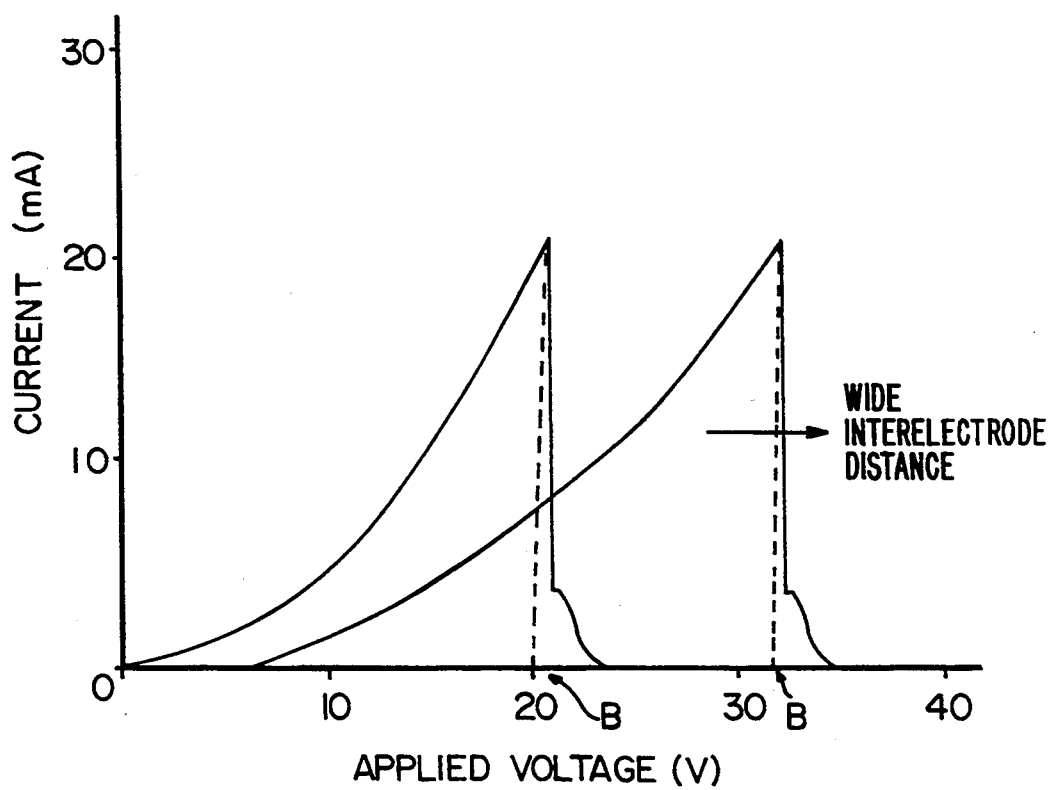
FIG. 4 is a graph showing the current-voltage characteristics of an electronic element according to the present invention.

Next, the electrical characteristics of the electronic element will be described with reference to FIG. 4. FIG. 4 is a graph showing the current-voltage characteristics of two electronic elements both configurated according to the invention but having different distances between the facing electrodes. As shown in the figure, in both the electronic elements, as the applied voltage increases, the current gradually increases. At a voltage value B, the facing electrodes are damaged, and the electric current rapidly decreases.

When the depth of the groove is fixed, the size of the void 6 is varied in accordance with the distance between the facing electrodes. The distance between the facing electrodes also affects the formation of the micro-cracks in the triangle-shaped oxide film formed between the facing electrodes or the formation of a low density region in this triangle-shaped oxide film.

As the distance between the facing electrodes becomes shorter, the electric current flows at a lower voltage. When the distance between the facing electrodes is long, the electric current flows at a higher voltage, the voltage value B also becomes high, and a leakage voltagge at no applied voltage decreases. Furthermore, when the distance between the facing electrodes is short, the rate of increase in the electric current is higher, compared with the case in which the distance between the facing electrodes is long.

The electric field strength can be calculated from the ratio of the applied voltage to the distance between the facing electrodes (i.e., applied voltage/distance between the facing electrodes). As shown in FIG. 4, the electric current begins to flow at a predetermined voltage. This indicates that an electron emission is initiated when the electric field strength reaches a predetermined value.

When the area occupied by the facing electrodes becomes large, the amount of flowing current increases, so that the electric field causes the electrons to be emitted from one of the end portions 10a of the facing electrodes. The amount of the electrons to be emitted depends on the area of the facing electrodes.

The facing electrodes are heated with an electric current flowing due to an applied voltage. When the density of the flowing electric current reaches a certain value, the facing electrodes are melted to vary the voltage-current characteristics. When the facing electrodes are made of aluminum, they are melted with an electric current having a small density, since the melting point of aluminum is low. On the other hand, the facing electrodes made of tungsten and titanium whose melting points are high are not readily melted.

Figure 5:
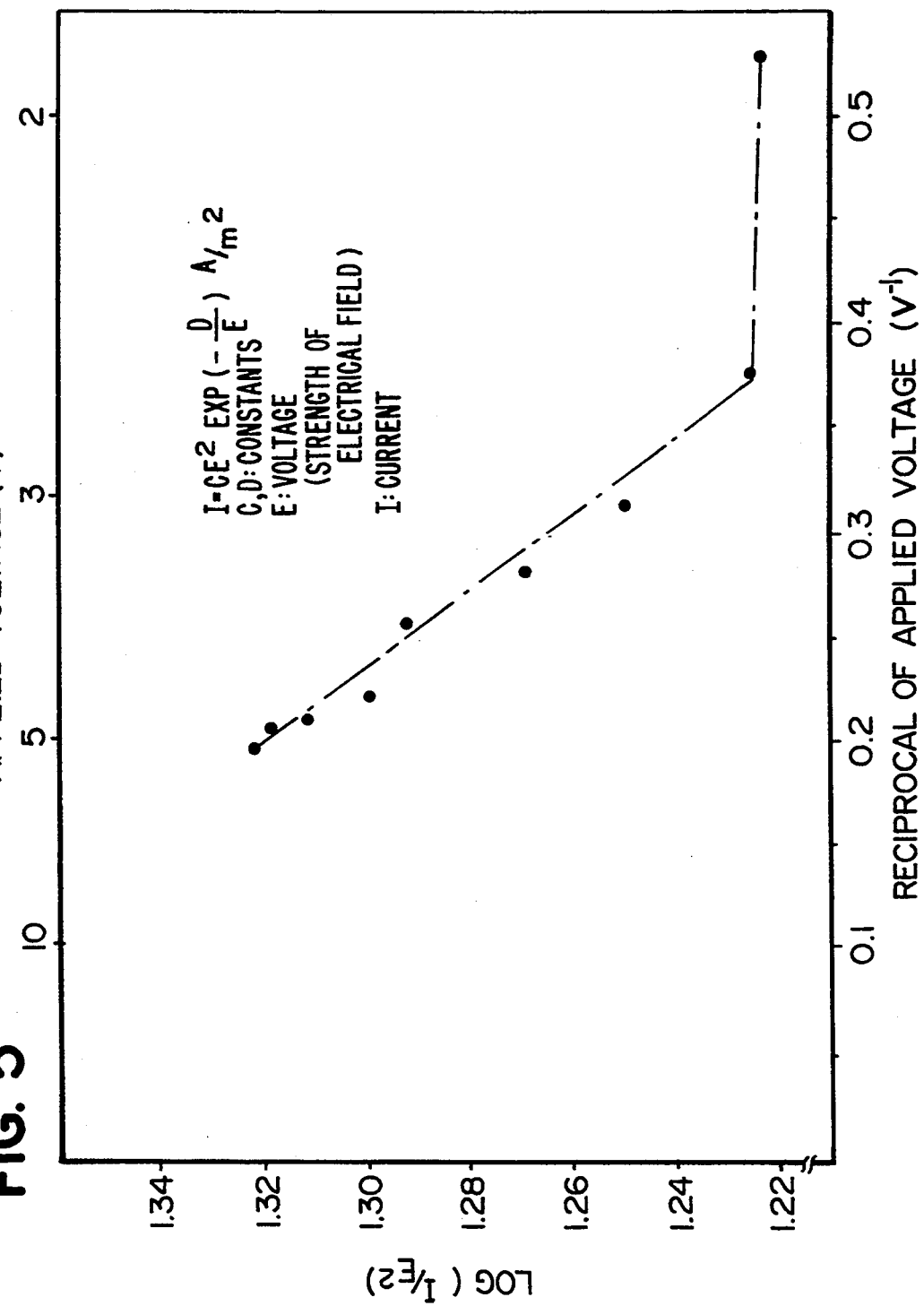
FIG. 5 is a graph showing the current-voltage characteristics of the electronic element according to the present invention.

In FIG. 5, the relationship between the applied voltage and the electric current is plotted in the semi-logarithmic form. The x-axis shows an inverse number of the applied voltage, and the y-axis shows a natural logarithm of a value obtained by dividing an electric current by the second power of the electrical field.

The relationship between the x-axis and the y-axis is represented by the following formulas (1) and (2):

$$I = CE^2 \exp(-D/E) \ [A/m^2] \quad (1)$$

i.e., $$\log(I/CE^2) = (-D/E) \quad (2)$$

wherein C and D denote constants, I an electric current, and E a voltage or an electric field.

When the inverse number of the applied voltage is 0.37 or more (the applied voltage is low), $\log(I/E^2)$ is 1.22, so that it appears the electrical current flows. However, actually, a leakage current flows through the surface region without the occurrence of the cold cathode emission.

When the inverse number of the applied voltage is 0.37 or less (the applied voltage is high), $\log(I/E^2)$ is changed from 1.22 to 1.32. In this case, the gradient is $-\omega$. That is, the electric current is in proportion to two-thirds power of the applied voltage. This voltage-current characteristics are similar to triode valve characteristics.

As described above, an electronic element having triode valve characteristics can be produced by forming thin films using an apparatus for producing an IC. This kind of electronic element is produced by using thin films, so that a minute element can be formed. Moreover, the electronic element can be produced by using a conventional process and apparatus for producing an IC, so that this electronic element can be used together with conventional semiconductor devices such as passive elements such as resistor and capacitor, and active elements including a bipolar transistor, a MOS transistor, etc.

When an electric field is applied between the facing electrodes 10, cold cathode emission occurs at a predetermined electric field strength. The cold cathode emission is not similar to the case of a thermionic tube in which metal is heated to generate a thermion emission. The potential of the metal of the facing electrodes 10 becomes the same as that of the outside thereof because of the applied electric field. The electrons are emitted from one of the facing electrodes 10. When the electric field strength is about 30 keV/cm, the electron emission from one of the facing electrodes 10 begins. At this time, the electron emission portion is covered with a protective film, so that this portion is not influenced by the environment. Thus, the electronic element can be used in the ambient air or in a vacuum. In an ordinary electronic circuit, a voltage of 30 keV is substantially large. In an electronic element with a dimension in the order of microns, the above-mentioned electric field can be formed by applying a voltage of about 3 to 6 V. In general, when the distance between the facing electrodes is long, it is required that the electrode which emits electrons have a tip end with an acute angle to partially strengthen the electric field. However, the distance between the facing electrodes 10 of the present invention is about 1 to 10 $\mu$m. The electrical field can be strengthened by an unevenness of the surface of the facing electrodes. In this way, the electric field causes cold cathode emission only by applying a voltage of several volts between the facing electrodes with a simple construction.

In the electric field having a strength greater than the predetermined value, the electric current caused by field emission is in proportion to three halves power of the strength of electric field. When a large voltage is applied between the right and left portions of the metal layer, an ohmic characteristic (i.e. the positive correlation between the voltage and the current) is lost. On the other hand, in the electronic element of the present invention, its resistance value decreases with an increase in the applied voltage. Examples of the material for the facing electrodes include aluminum which is melted with a small amount of electric current, and tungsten which has a high melting point, so that a great amount of current can flow therethrough. In the case of facing electrodes made of aluminum, they are insulated from each other, or the aluminum is melted so as to connect the facing electrodes with each other so that the facing electrodes becoming electrically conductive. When the distance between the facing electrodes is about 0.5 $\mu$m or less, a short circuit can readily occur at the time of current flow. When the distance between the facing electrodes is about 0.5 to 1.5 $\mu$m, the uneven portions of the facing electrodes are melted to increase its resistance, thereby stopping the current flow. When the distance between the facing electrodes is 2.0 $\mu$m or more, the electric field does not partially concentrate. Because of this, the current value becomes low. However, such a current generation has a good reproduction property, so that the current can be observed reversely. In this case, the facing electrodes 10 are neither insulated nor short-circuited. The insulating film formed on the upper portion of the facing electrodes is made of a plasma TEOS (tetraethoxy silane) type oxide film.

Figure 6:
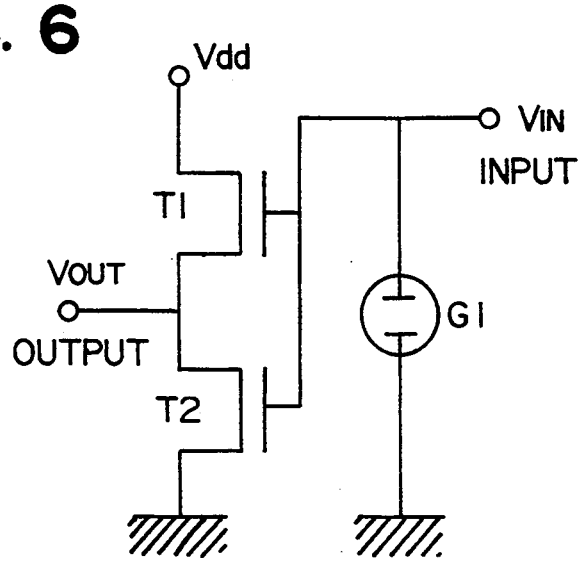
FIG. 6 is a block diagram of the forth example in which an electronic element of the present invention is applied to a circuit.

FIG. 6 shows a protective circuit including the electronic element of the present invention, which is used for protecting a transistor at the external signal input portion. Transistors at the external signal input portion are denoted as T1 and T2. The drain of the transistor T1 is connected to the source of the transistor T2, and an output Vout is obtained from the connecting point. The source of the transistor T1 is connected to the power source voltage Vdd, and the drain of the transistor T2 is grounded. The transistor T1 and the transistor T2 have a common gate and connected to an input Vin. The electronic element G1 is connected between the input Vin and the ground. The electronic element G1 is connected in parallel with the transistors to be protected.

Figure 7:
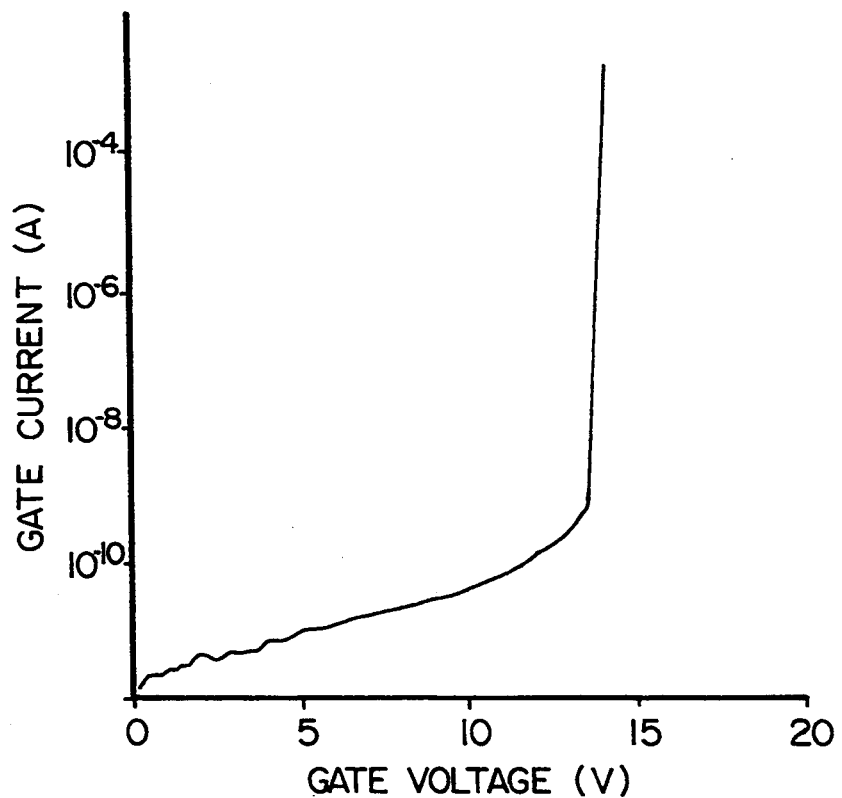
FIG. 7 is a graph showing the electrical characteristics of the electronic element in the forth example.

FIG. 7 shows the relationship between an input voltage Vin applied to the gate of the transistor to be protected and a gate current. When the transistors T1 and T2 are provided with a voltage of about 14 V or more, the gate oxide film below the gate is damaged.

As the input voltage Vin is applied to the gate of the transistors T1 and T2, a voltage between the facing electrodes of the electronic element G1 rises. When the input voltage Vin reaches 10 V, the electronic element G1 becomes conductive because of the electron emission, thereby maintaining the gate voltage of the transistors T1 and T2 at about 10 V. Even though the input voltage Vin rises further, the gate voltage of the transistors T1 and T2 is kept within about 10 V.

The circuit shown in FIG. 6 is constructed so as to keep the voltage between the input and the ground at a certain value. It is also possible that the voltage between the power source and the input is kept at a certain value.

The electronic element shown in FIG. 6 is used for protecting the gate oxide film of the transistor. In general, this electronic element can be used for protecting an element (a terminal) which is likely to malfunction or be damaged by being subjected to a voltage of a predetermined value or more. In the electronic element of the present invention, when an applied voltage reaches a predetermined value, the strength of an electric field caused by the applied voltage reaches a threshold value at which an electron is emitted, whereby an electric current begins to flow between the facing electrodes of the electronic element. Accordingly, an excessive voltage is prevented from being applied to the gate and drain of the transistor and other elements to be protected.

A value of the excessive voltage which should not be applied is different in accordance with the type of the element (the terminal) to be protected. To control the value of the voltage to be maintained in the element to be protected, the distance between the facing electrodes of the electronic element of the present invention is varied. When the distance between the facing electrodes are varied, the electric field generated during the application of the predetermined voltage is changed to control the voltage value to be maintained. For example, when an electron is emitted at an electric field of 30 kV/cm with the distance between the facing electrodes being 4 $\mu$m, a voltage of not more than 12 V can be applied. Also, the voltage value can be controlled by a potential of a control electrode described later.

To increase a current which can be flown (hereinafter, referred to as an allowable current) through the electronic element G1, the area of the opposite faces of the facing electrodes (i.e., the product of the height and the width of each opposite face) is enlarged. The allowable current depends on the size of the void, micro-cracks and low-density region formed in the insulating film disposed between the facing electrodes.

The size of the void, micro-cracks and low-density region formed in the insulating film is determined by the depth of the groove between the facing electrodes and by the step coverage of the insulating film formed thereon. The size of the void, micro-cracks and low-density region can be determined by selecting the depth and shape of the groove, and the condition and method for forming the insulating film.

To protect the transistors T1 and T2 shown in FIG. 6, it is necessary that the pair of facing electrodes of the electronic element G1 becomes conductive with a predetermined applied voltage, and that these facing electrodes are constructed so as to be hard to damage. For that purpose, metal with a high melting point such as titanium, tungsten or an alloy thereof is suitable for a material of the facing electrodes. The distance between the facing electrodes are preferably in the range of 2 $\mu$m to 10 $\mu$m.

Figure 8A:
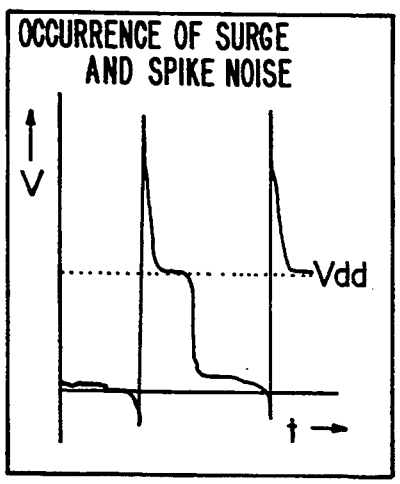
FIGS. 8a and 8b show graphs showing the electrical characteristics of the electronic element in the forth example.
Figure 8B:
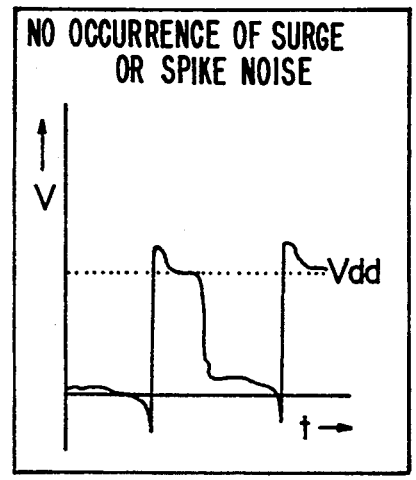

FIGS. 8a and 8b show the voltage applied to the transistors of the circuit shown in FIG. 6, with respect to the elapsed time. FIG. 8a shows a curve indicating the voltage applied to the gate of the transistors (the input voltage Vin) with respect to the elapsed time.

At the moment when the input voltage Vin rises to the level of the power source voltage Vdd, surge and spike noise appear on the voltage. Because of this, a voltage which is higher than the desired value is applied to the gate of the transistors T1 and T2 at the same time of the application of the power source voltage Vdd. Since the electronic element G1 is connected in parallel with the transistor, when a voltage of a predetermined value or more is applied, the electronic element G1 is short-circuited as described above. Accordingly, as shown in FIG. 8b, the voltage applied to the transistors T1 and T2 is not more than the predetermined value.

Figure 9:
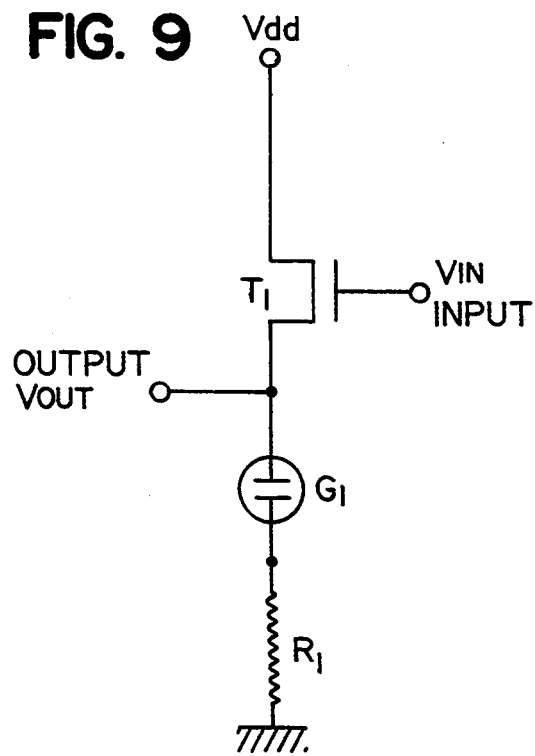
FIG. 9 is a block diagram of the fifth example in which an electronic element of the present invention is applied to a circuit.

FIG. 9 shows a protective circuit of the second example for protecting another transistor by using the electronic element of the present invention.

The drain of a transistor T1 is connected to an electronic element G1. An output Vout is obtained from the connecting point. The source of the transistor T1 is connected to a power source with a voltage Vdd, and the electronic element G1 is grounded through a resistance R1. The gate of the transistor T1 is connected to an input Vin. The electronic element G1 is directly connected to the drain of the transistor T1 to be protected.

Figure 10:
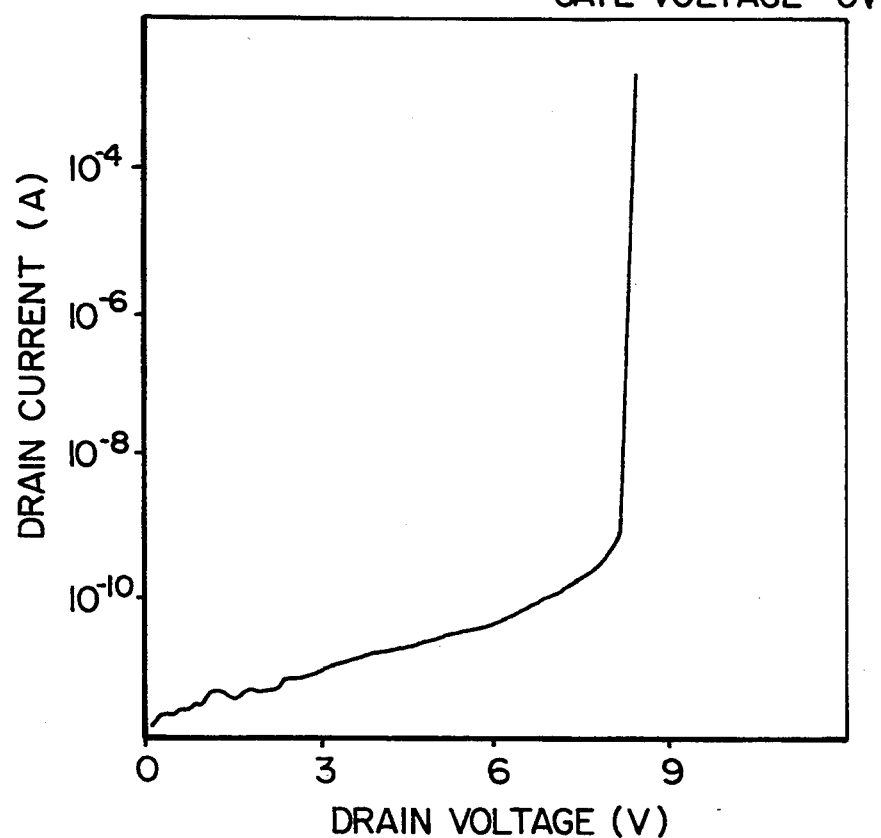
FIG. 10 is a graph showing the electrical characteristics of the electronic element in the fifth example.

FIG. 10 shows the relationship between the voltage applied to the transistor T1 to be protected and the drain current of the transistor T1. There is a possibility that this transistor T1 is damaged when a power source voltage Vdd of 8 V or more is applied between the source and the drain thereof.

The drain current increases with an increase in the voltage applied between the source and the drain of the transistor T1. When the applied voltage reaches 7 V, a current of about 10 mA flows through the drain of the transistor T1. At this time, the electronic element is damaged so as to be burnt out, and the drain current of the transistor T1 is rapidly decreased. As the result, even though an applied voltage is increased, the current does not flow through the drain of the transistor T1 any more.

In this example, the electronic element for protecting a transistor is described. This electronic element can also be used for protecting an element (a terminal) which causes faulty operation and which is damaged, when a current of a predetermined value or more flows therethrough. In the electronic element, when a current reaches a predetermined value or more, the facing electrodes are damaged. Therefore, an electron is not emitted therefrom, and an excess amount of current does not flow through an element or a circuit to be protected.

A current value required for protecting an element and a circuit can be controlled by the area between the facing electrodes, as well as the size of a void formed therebetween, micro-cracks, and low-density region.

To change the size of the void, micro-cracks, and low-density region, it is necessary to change the step coverage of an insulating film formed in the groove and on the facing electrodes. A current value can be changed by selecting the height and shape of the groove, and a method for forming the insulating film. As a material for the facing electrodes of the electronic element in this example, a metal having a low melting point, such as aluminum, or an alloy thereof is preferred, since the facing electrodes should be damaged with the application of a predetermined current. The distance between the facing electrodes is preferably in the range of 0.5 $\mu$m to 2.0 $\mu$m.

Figure 11B:
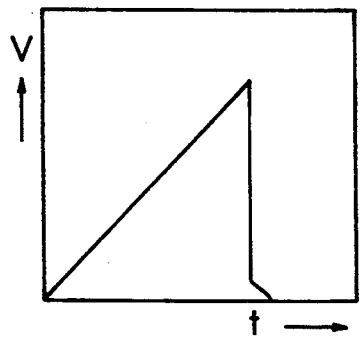
FIGS. 11a and 11b show graphs showing the electrical characteristics of the electronic element in the fifth example.
Figure 11A:
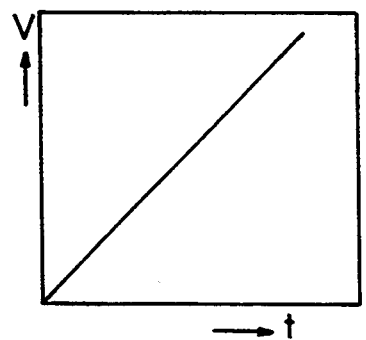

FIGS. 11a and 11b show the voltage applied to the transistor of the circuit shown in FIG. 9, with respect to the elapsed time.

FIG. 11a shows a curve indicating the voltage Vin as an input signal. The voltage applied from the input Vin is increased with an increase in the elapsed time.

FIG. 11b shows a curve indicating the output voltage Vout with respect to the elapsed time. To prevent the input voltage Vin from increasing to a predetermined value or more and destroying the transistor T1, the facing electrodes of the electronic element G1 is damaged so as to be in an insulation condition. Because of this, the output voltage Vout becomes zero, when the electronic element G1 is damaged.

Figure 12:
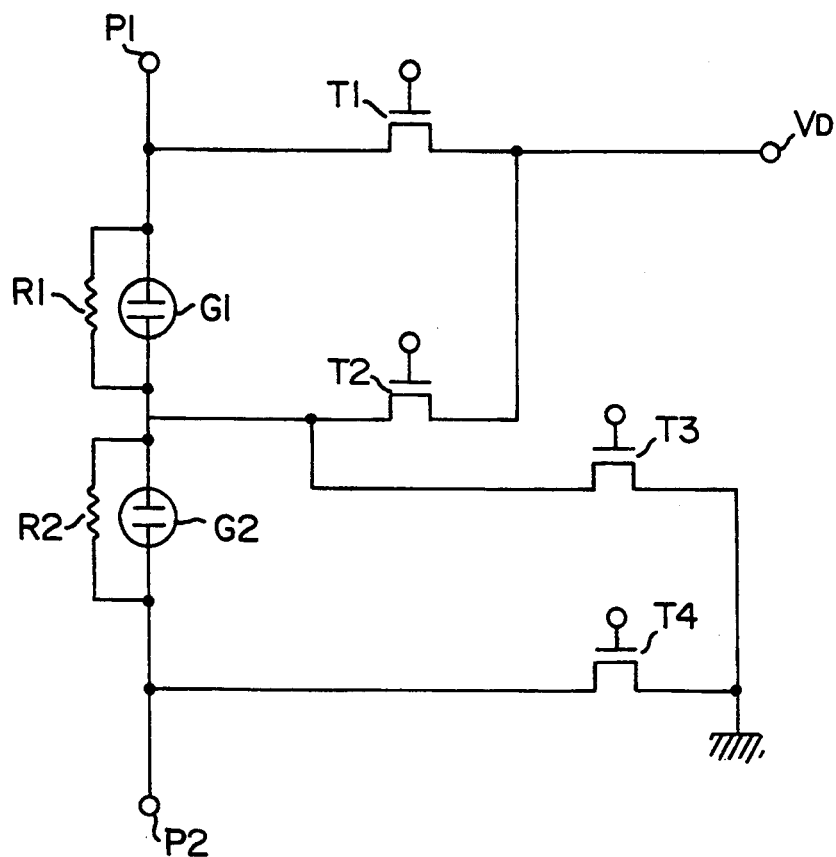
FIG. 12 is a block diagram of the sixth example in which an electronic element of the present invention is applied to a circuit.

FIG. 12 shows an example of a programmable circuit. The circuit has previously been formed so that its construction can be arranged in several ways, thereby allowing a desired circuit to be selected. In this example, a load resistance of a certain circuit is selected. When a voltage is applied, an electronic element is insulated or short-circuited.

In the case of the insulation, as a material for the facing electrodes, a metal having a low melting point, such as aluminum, or an alloy thereof is used, since the facing electrodes should be damaged so as to lose their original shape, when a predetermined value of current flows through the electronic element. The distance between the facing electrodes is preferably in the range of 0.5 $\mu$m to 2.0 $\mu$m.

In the case of a short circuit, electron emission causes the facing electrodes to fuse, when a predetermined value of current flows through the electronic element. Then, a short circuit is caused between the facing electrodes. As a material for the facing electrodes, a layered structure formed from a metal having a low melting point, such as aluminum, or an alloy thereof, and a metal having a high melting point, such as titanium and tungsten, or an alloy thereof is used, since the facing electrodes should be damaged so as to fuse without substantially losing their original shape. The distance between the facing electrodes is preferably 0.5 $\mu$m or less.

In FIG. 12, G1 and G2 denote electronic elements to be short-circuited or to be insulated, T1, T2, T3, and T4 transistors, R1 and R2 resistors, and P1 and P2 nodes in this circuit. The transistors T1, T2, T3, and T4 are used for the short-circuit or insulation of the electronic elements G1 and G2. The nodes P1 and P2 are connected to the particular circuits, respectively. The electronic elements function as a switch for selecting either an insulation or a short circuit, and a load resistance of the respective circuits is selected. Both ends of the electronic element G1 are connected to the resistor R1, and both ends of the electronic element G2 is connected to the resistor R2. The electronic elements G1 and G2 are connected to each other, and the connecting point therebetween is connected to the transistor T2. This connecting point is also connected to the transistor T3 which is connected in parallel with the transistor T2. The other end of the electronic element G1 is connected to the node P1, and the other end of the electronic element G2 is connected to the node P2. The node P1 is connected to the transistor T1. The other end of the transistor T1 is connected to a terminal voltage VD and the transistor T2. The node P2 is connected to the transistor T4. The other end of the transistor T4 is grounded and connected to the transistor T3.

When the transistors are not in operation, the electronic elements G1 and G2 are not connected to each other. At this time, the resistors R1 and R2 are directly connected to each other, and the load resistance between the nodes P1 and P2 becomes equal to the resistance value of R1+R2.

When the transistors T1 and T3 are in a conductive condition, the electronic element G1 is short-circuited or insulated.

Under the condition that the electronic element G1 is neither short-circuited nor insulated, when the transistors T1 and T3 become conductive, a great amount of current flows through the electronic element G1 by the application of the terminal voltage VD to the electronic element G1, and the electronic element G1 is short-circuited or insulated. As described above, whether the electronic element G1 is short-circuited or insulated is determined by the material and structure of the facing electrodes and the distance therebetween.

When the electronic element G1 is short-circuited, the load resistance between the nodes P1 and P2 becomes equal to the resistance value of the resistor R2. When the electronic element G1 is insulated, the load resistance becomes equal to the resistance value of the resistor R1.

Under the condition that the electronic element G1 is neither short-circuited nor insulated, when the transistors T2 and T4 become conductive, a great amount of current flows through the electronic element G2 by the application of the terminal voltage VD to the electronic element G2, and the electronic element G2 is short-circuited or insulated. As described above, whether the electronic element G2 is short-circuited or insulated is determined by the material and structure of the facing electrodes and the distance therebetween.

When the electronic element G2 is short-circuited, the load resistance between the nodes P1 and P2 becomes equal to the resistance value of the resistor R1. When the electronic element G2 is insulated, the load resistance becomes equal to the resistance value of the resistor R2. When both electronic elements G1 and G2 are short-circuited, the load resistance between the nodes P1 and P2 becomes zero. When both electronic elements G1 and G2 are insulated, the load resistance between the nodes P1 and P2 becomes equal to the resistance value of R1+R2.

According to the above operation, the resistance between the nodes P1 and P2 can be selected from the values of zero, R1, R2, and R1+R2.

In the case of a circuit in which resistors R1 and R2 are not connected to each other, the electrical connection between the nodes P1 and P2 is broken down by insulating one of the electronic elements G1 and G2. Accordingly, with the application of such a circuit to the circuit shown in FIG. 12, five different resistance values (zero, R1, R2, R1+R2, and a high level of resistance (state of insulation)) can be realized between the nodes P1 and P2. If a plurality of the circuits shown in FIG. 12 are combined together and connected to another circuit, it is possible to construct a logical circuit. At that time, transistors and/or diodes can be incorporated in the circuit instead of the resistors R1 and R2, if necessary.

Figure 13:
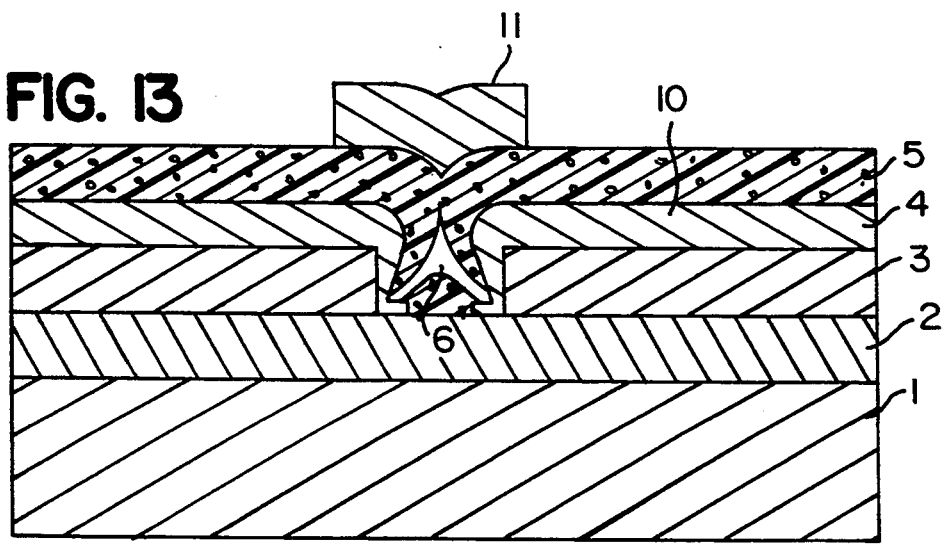
FIG. 13 is a sectional view showing the forth example of an electronic element according to the present invention.

FIG. 13 shows the forth example of an electronic element according to the present invention. The structure of the electronic element of this example differs from that of the first example in that a control electrode is disposed on the surface of the protective film 5 covering the groove. The oxide film 2 is formed on the substrate 1. On the surface of the oxide film 2 except for the portion where the facing electrodes are to be provided, the oxide film 3 is formed. The metal layer 4 covers the bottom and side walls of the groove and the surface of the oxide film 3. A predetermined region of the metal layer 4 formed on the bottom of the groove is removed. The oxide film 2 is exposed at the predetermined region from which the metal layer has been removed. Moreover, the protective film 5 is deposited on the entire surface of metal layer 4 so as to cover the upper portion of the groove. On the surface of the oxide film 2, the protective film 5 is formed so as to have a triangular cross-section. The void 6 is formed in the groove depending upon the conditions for the deposition of the protective film 5. The control electrode 11 is formed on the protective film 5.

The control electrode 11 is used for varying the electric field in the groove with the application of a voltage. The cold cathode emission is caused by this electric field. In the electronic elements of the first to third examples, a voltage is applied to the facing electrodes to cause an electron emission. In the forth example, a voltage is applied to the facing electrodes to generate an electric field, and at the same time the electric field in the vicinity of the facing electrodes 10 are varied from outside using the control electrode 11, thereby regulating a current between the facing electrodes.

When the distance between the facing electrodes is about 3 $\mu$m or less, the control electrode 11 has substantially no effect. That is, when the distance between the facing electrodes 10, or the distance between the facing electrodes 10 and the control electrode 11 is long, the electric field generated by a voltage applied to the control electrode 11 is small and the desired effects cannot be obtained. When the distance between the facing electrodes 10 exceeds over 3 $\mu$m, the electric field generated by a voltage applied to the control electrode 11 exerts great effects to an electron emission. Accordingly, in addition to the distance between the facing electrodes, the quality of the electrodes, the size and depth of the groove, and the voltage applied to the control electrode 11 have influence on the amount of the current flowing between the facing electrodes.

The electronic element with the above structure can be used as an active element in place of a transistor. Moreover, this electronic element can be used as a protective element for protecting a specific circuit. For example, in the case of an EEPROM which is an electrically erasable programmable ROM, an applied voltage when data is written is higher than that of an ordinary element in operation. Because of this, a higher voltage is also required for a protective circuit. However, when the voltage of the protective circuit is too high, there is a possibility that the element to be protected may be damaged. In view of this problem, the electronic element of this example is useful as a protective circuit, since the voltage required for operating this electronic element can be varied by using the voltage applied to the control electrode from outside.

There have been known elements using cold cathode emission. However, these elements with electrodes for emitting electrons are sealed in the respective packages under a vacuum, so that it is impossible to use these elements together with other semiconductor devices. Also, since these elements do not have protective films, the electrodes are likely to be damaged. The electronic element of the present invention comprises a protective film and can be produced in accordance with a process for producing a semiconductor device, so that this element can be used together with other semiconductor devices and have excellent reproductivity.

Figure 14:
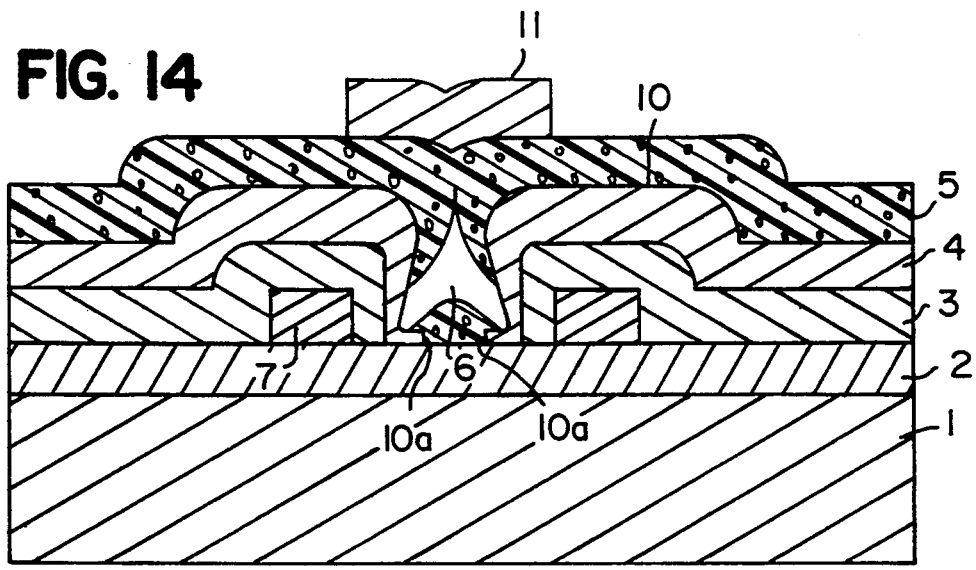
FIG. 14 is a sectional view showing the fifth example of an electronic element according to the present invention.

FIG. 14 shows the fifth example of an electronic element according to the present invention. The structure of the electronic element of the fifth example differs from that of the second example in that a control electrode is disposed on the protective film. FIG. 14 is a sectional view showing the electronic element in which the depth of a groove is made large so that a film having micro-cracks or low density can be formed in the void 6.

The oxide film 2 is formed on the entire surface of the substrate 1 which is made of a material such as a semiconductor, conductor, and insulator. The polysilicon portions 7 are independently formed on the oxide film 2 so as to sandwich the pair of facing electrodes 10. The oxide film 3 covers the surfaces of the polysilicon portions 7 and the oxide film 2. The groove is formed in the portion of the oxide film 3, which is positioned in the middle between the polysilicon portions 7, by using a resist pattern so that it has side walls perpendicular to the substrate 1. On the upper surface of the oxide film 3, aluminum is deposited to form the metal layer 4. The metal layer 4 thus formed constitutes the end portions 10a of the facing electrodes 10 in the groove of the oxide film 3. The protective film 5 made of an oxide film is formed on the surface of the metal layer 4.

A predetermined region of the metal layer 4 formed on the bottom of the groove is removed. On the thus exposed surface of the oxide film 2 and on the metal layer 4 is formed a protective film 5. The portion of the protective film 5 on the oxide film 2 is triangular in cross section. In the groove, the void 6 is formed. The control electrode 11 is formed on the surface of the protective film 5.

The control electrode 11 is used for varying the electric field in the groove with an applied voltage. The cold cathode emission is caused by this electric field. In the fifth example, a voltage is applied between the facing electrodes 10 to generate an electric field, and at the same time the electric field in the vicinity of the facing electrodes 10 is varied from outside using the control electrode 11, thereby regulating a current between the facing electrodes.

The electronic element of the fifth example can be used as an active element instead of a transistor. It can also be used as a protective element for protecting a prescribed circuit in the same manner as in the foregoing examples.

Figure 15:
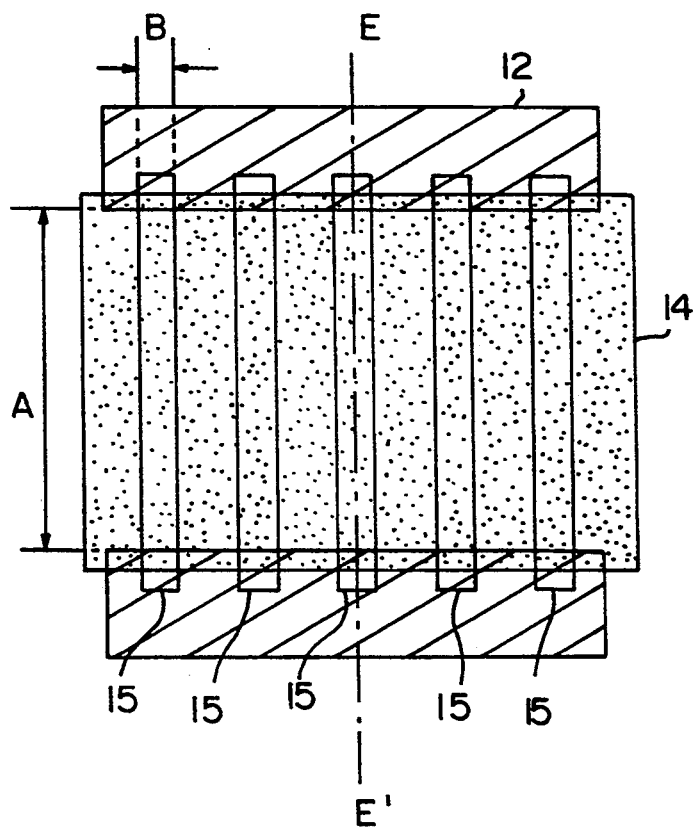
FIG. 15 is a plan view showing an electronic element of the present invention.

FIG. 15 is a plan view showing the forth example of the electronic element. FIG. 13 showing the forth example is a sectional view taken along a line E—E' of FIG. 15. A region 12 corresponds to the metal layer 4 functioning as the facing electrodes 10. The distance A between the facing electrodes 10 is 10.0 μm. In this electronic element, the insulating film formed on the bottom of each groove 15 between the facing electrodes 10 have micro-cracks, a void or a low density region to obtain electrical conductivity. The groove 15 has a length of 12.0 μm which is longer than that of the distance A between the facing electrodes 10, and a width B of 1.0 μm. The distance A between the facing electrodes 10 can be set at an appropriate valve selected from a relatively large range of values so as to change the characteristics of the resulting electronic element. However, the width B of the groove is limited to 1.0 μm in order to form micro-cracks or a low-density region therein. Accordingly, the length of each of the facing electrodes in one cell becomes 1.0 μm. An allowable current is varied by connecting a plurality of cells in parallel. In FIG. 15, five cells are connected in parallel to each other. In this example, when the facing electrodes 10 overlap the control electrode 11, variation in the voltage-current characteristics can be minimized.

Figure 16:
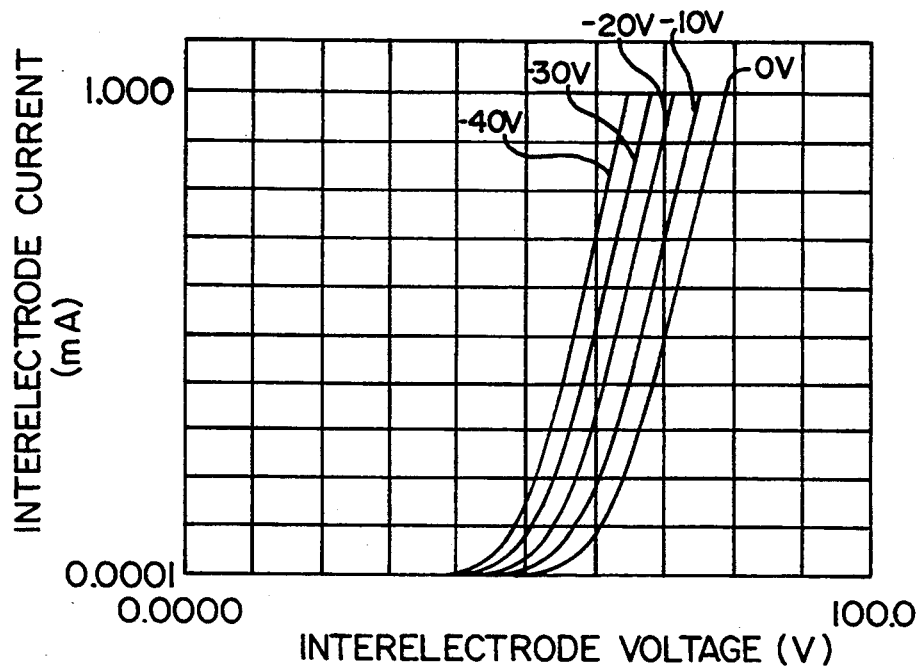
FIG. 16 is a graph showing the vacuum-tube characteristics of an electronic element of the present invention.
Figure 17:
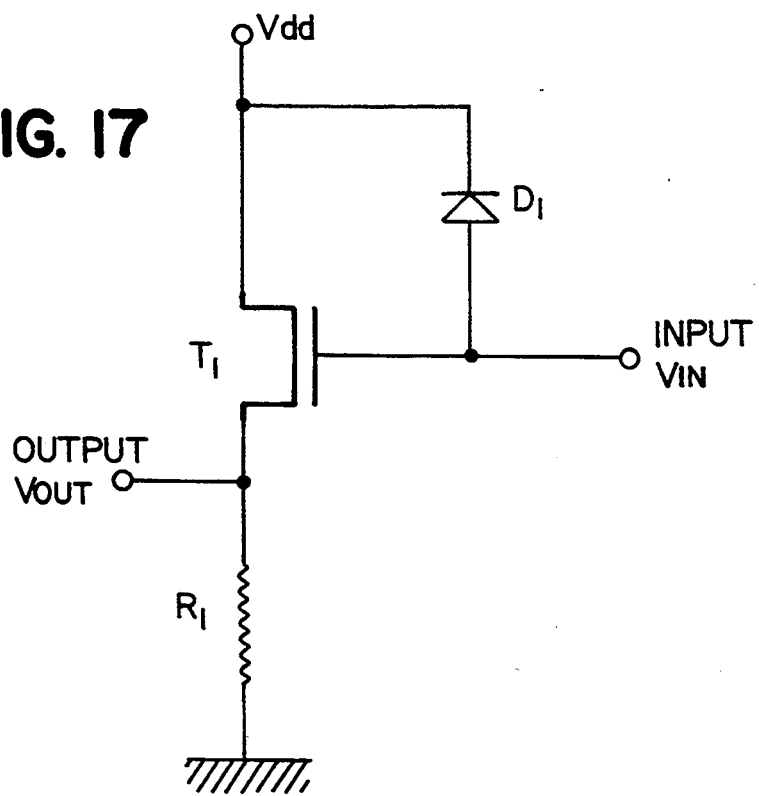
FIG. 17 is a circuit diagram illustrating a conventional electronic element.

FIG. 16 is a graph illustrating that the electronic element shown in FIG. 15 functions as an active element. The x-axis shows a voltage applied between the electrodes. The y-axis shows a current flowing between the electrodes. A voltage applied to the control electrode is taken as a parameter.

Under the condition that the voltage applied to the control electrode is set to 0, a very small level of current flows between the electrodes when the voltage therebetween is up to about 50 V. When the voltage between the facing electrodes reaches 60 V or more, the current which flows therebetween rapidly increases. Since an extremely high current causes damage to the electronic element, the current is limited to 1 mA in this experiment.

The voltage between the facing electrodes required for the initial flow of the current is different in accordance with the voltage applied to the control electrode. Also, the voltage between the facing electrodes required for the flow of a current of about 1 mA is different in accordance with the voltage applied to the control electrode. With an increase in the negative voltage as a reverse bias applied to the control electrode, the voltage between the facing electrodes required for the initial flow of the current becomes lower. Also, the voltage required for the control electrode to allow a current of about 1 mA to flow between the facing electrodes becomes lower. For example, when the voltage applied to the control electrode is −40 V, the voltage between the facing electrodes required for the initial flow of the current is 40 V. When the current flowing between the electrodes is about 1 mA, the voltage between the electrodes is about 65 V.

As described above, in the electronic element having the control electrode, the voltage-current characteristics can be controlled by varying the voltage applied to the control electrode. Moreover, this electronic element has triode characteristics, so that it can be used in an electronic circuit formed by using a vacuum tube.

In the above-described examples, the first metal layer is used as facing electrodes. When a plurality of metal layers are formed, the second metal layer or a third metal layer can also be used as facing electrodes. Moreover, a plurality of control electrodes can be used.

As described above, function elements, equipment, or systems can be protected from a high voltage, and a high current (including surge and noise) by using the electronic element of the present invention as a protective circuit. The voltage required for operating a protective circuit can be changed, if desired, by changing the voltage applied to the control electrode.

The electronic element of the present invention can readily be formed by using an ordinary method for producing an IC, with a mask for the electrode element incorporated into an ordinary mask for use in the production of the IC. Moreover, the construction of a circuit can be modified after the formation of the electronic element. Accordingly, a circuit of good quality can be produced for a short period of time.

It is understood that various other modifications will be apparent to and can be readily made by those skilled in the art without departing from the scope and spirit of this invention. Accordingly, it is not intended that the scope of the claims appended hereto be limited to description as set forth herein, but rather that the claims be construed as encompassing all the features of patentable novelty that reside in the present invention, including all features that would be treated as equivalents thereof by those skilled in the art to which this invention pertains.

What is claimed is:

1. An electronic element comprising a substrate; a first insulating film having a groove with opposing side walls within said groove formed on the substrate; a pair of electrodes formed on a surface of the first insulating film and on surfaces of said opposing side walls of the groove, end portions of the electrodes being separated and facing each other along the opposing side walls in the groove; and a second insulating film formed at least on the end portions of the electrodes, the second insulating film having at least one of micro-cracks therein and a lower film density than that of the first insulating film.

2. An electronic element according to claim 1, wherein the substrate is made of a semiconductor material.

3. An electronic element comprising a substrate; a first insulating film formed on the substrate; a second insulating film having a groove with opposing side walls within said groove formed in the second insulating film and on the first insulating film; a pair of electrodes formed on a surface of the second insulating film and on surfaces of said opposing side walls of the groove, end portions of the electrodes being separated and facing each other along the opposing side walls in the groove; and a third insulating film formed at least on the electrodes.

4. An electronic element according to claim 3, wherein an electric field, produced by an applied voltage, enables electrons to be emitted from one of the end portions of one of the electrodes to the end portion of the other electrode by way of the third insulating film, whereby an electric current flows between the end portions.

5. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed on the electrodes and the bottom face of the groove, the portion of the third insulating film, which is positioned on the bottom face of the groove, having a triangular cross-section.

6. An electronic element according to claim 5, wherein the third insulating film has a lower film density than that of the first and second insulating film.

7. An electronic element according to claim 5, wherein the third insulating film has micro-cracks therein.

8. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed on the electrodes and the bottom face of the groove, the portion of the third insulating film, which is positioned on the bottom face of the groove, having a triangular cross-section so as to form a void in the groove.

9. An electronic element according to claim 8, wherein the inside of the void is under reduced pressure.

10. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed at least on the electrodes, wherein a current flowing between the electrodes corresponds to two-thirds power of an applied voltage.

11. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; a third insulating film formed at least on the electrodes; and a conductive film formed on the third insulating film.

12. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; and a third insulating film formed at least on the electrodes, wherein the substrate is provided with at least one semiconductor device.

13. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; a third insulating film formed at least on the electrodes; and a conductive film formed on the third insulating film, wherein the electronic element has switching characteristics.

14. An electronic element comprising a substrate; a first insulating film formed on the substrate; a second insulating film having a groove, which is formed on the first insulating film; a pair of electrodes formed on the second insulating film and the inner surface of the groove, the end portions of the electrodes being separated and facing each other in the groove; a third insulating film formed at least on the electrodes; and a conductive film formed on the third insulating film, wherein the substrate is provided with at least one semiconductor device, and the electronic element performs the operation of switching the semiconductor device.

15. An electronic element according to claim 1, wherein
an electric current flows between said end portions of said electrodes when a voltage applied between said electrodes becomes equal to or more than a predetermined value.

16. An electronic element comprising:
a substrate;

a first insulating film formed on the substrate;

a second insulating film having a groove therein formed on the first insulating film, said groove having opposing side walls within said second insulating film;

a pair of electrodes formed on the second insulating film and on surfaces of said opposing side walls in the groove, end portions of the electrodes being separated and facing each other in the groove; and a third insulating film formed at least on the electrodes, wherein an electric field, produced by an applied voltage, enables electrons to be emitted from one of the end portions of one of the electrodes to the end portion of the other electrode by way of the third insulating film, whereby an electric current flows between the end portions.

* * * * *